(12) United States Patent
Liu

(10) Patent No.: US 11,206,746 B1
(45) Date of Patent: Dec. 21, 2021

(54) FLUID HEAT DISSIPATION DEVICE

(71) Applicant: Chia-Hsing Liu, Taipei (TW)

(72) Inventor: Chia-Hsing Liu, Taipei (TW)

( * ) Notice: Subject to any disclaimer, the term of this patent is extended or adjusted under 35 U.S.C. 154(b) by 70 days.

(21) Appl. No.: 16/896,222

(22) Filed: Jun. 9, 2020

(51) Int. Cl.
*H05K 7/20* (2006.01)
*G06F 1/20* (2006.01)

(52) U.S. Cl.
CPC ..... *H05K 7/20336* (2013.01); *H05K 7/20309* (2013.01); *G06F 1/203* (2013.01); *G06F 2200/201* (2013.01)

(58) Field of Classification Search
CPC ............ H05K 7/20336; H05K 7/20309; F28D 15/00; G06F 1/203; G06F 2200/201; H01L 23/427; B23P 2700/09
See application file for complete search history.

(56) References Cited

U.S. PATENT DOCUMENTS

| | | | | |
|---|---|---|---|---|
| 2007/0209784 | A1* | 9/2007 | Peng ..................... | H01L 23/473 165/120 |
| 2014/0247557 | A1* | 9/2014 | Qiu ........................ | H01L 23/46 361/700 |
| 2015/0144295 | A1* | 5/2015 | Miura .................. | F28D 15/0266 165/10 |
| 2017/0363367 | A1* | 12/2017 | Yeh ........................ | H01L 23/427 |
| 2019/0043779 | A1* | 2/2019 | Chung ................ | H01L 23/3675 |
| 2020/0359530 | A1* | 11/2020 | Uchino .................... | G06F 1/203 |
| 2020/0400382 | A1* | 12/2020 | Cheng ................. | F28D 15/0283 |
| 2021/0118764 | A1* | 4/2021 | Lin ........................ | G06F 1/1656 |
| 2021/0259134 | A1* | 8/2021 | Uppal .................. | H05K 7/2039 |
| 2021/0274640 | A1* | 9/2021 | Chen ..................... | H05K 7/205 |
| 2021/0289663 | A1* | 9/2021 | Chen .................... | F28D 15/0283 |

* cited by examiner

*Primary Examiner* — Gordon A Jones
(74) *Attorney, Agent, or Firm* — Li & Cai Intellectual Property Office

(57) ABSTRACT

A fluid heat dissipation device is provided. The fluid heat dissipation device includes a heat sink body and a plurality of pasting elements. The heat sink body is a porous structure, and pores of the heat sink body are configured to enable the heat sink body to absorb a working fluid that can be liquid or gas. The pasting elements are fixed on a first surface of the heat sink body. The pasting elements include polymer materials and are sheet-like colloids. The heat sink body is fixedly attached onto an outer surface of an electronic device through the pasting elements. A thickness gap of the pasting element is a vaporization chamber, and the working fluid in the pores can absorb heat from the electronic device and then be vaporized to remove heat through the heat sink body.

8 Claims, 5 Drawing Sheets

FLUID HEAT DISSIPATION DEVICE

FIELD OF THE DISCLOSURE

The present disclosure relates to a fluid heat dissipation device, and more particularly to a fluid heat dissipation device that is configured to be fixedly attached on an outer surface of an electronic device to assist in cooling of the electronic device.

BACKGROUND OF THE DISCLOSURE

In recent years, the high-speed computing and high density structure of laptops and mobile devices have been integrated and developed for users requiring faster computing speed for multi-window operations and gaming. Accordingly, larger capacity rechargeable batteries and advanced heat dissipation devices are needed. Furthermore, since the temperature inside conventional electronic devices, such as mobile phones, laptops, and tablets, continues to rise during the operation of the electronic devices, the computing performance thereof would be reduced. Accordingly, the electronic devices would need additional heat dissipation devices. In conventional technology, the additional heat dissipation devices all use fans, which in turn increase energy consumption and generate fan noise and vibration. Furthermore, since the weight of the conventional heat dissipation device is heavy and the heat dissipation device is attached onto the electronic device through clips or suction cups, the heat dissipation device cannot be fixedly attached onto the electronic device, and is prone to detach therefrom.

SUMMARY OF THE DISCLOSURE

In response to the above-referenced technical inadequacies, the present disclosure provides a fluid heat dissipation device. The fluid heat dissipation device is a water-cooled radiator when a working fluid of the fluid heat dissipation device is liquid, and the fluid heat dissipation device is an air-cooled radiator when the working fluid of the fluid heat dissipation device is gas. The fluid heat dissipation device is environmentally friendly and energy efficient and requires no power supply. Furthermore, the fluid heat dissipation device is free from a fan noise and a vibration interference, and can be stably and fixedly attached onto the electronic device.

In one aspect, the present disclosure provides a fluid heat dissipation device, the fluid heat dissipation device includes a heat sink body and a plurality of pasting elements. The heat sink body is a porous structure and includes a plurality of pores that are configured to enable the heat sink body to absorb a gas or liquid working fluid, in which the heat sink body has a first surface and a second surface, and the first surface and the second surface are respectively located on two opposite sides of the heat sink body. The pasting elements are fixed on the first surface of the heat sink body, in which the pasting elements include polymer materials and are sheet-like colloids. The heat sink body is configured to be fixedly attached onto an outer surface of an electronic device through the pasting elements, the first surface is close to the outer surface of the electronic device, and the pasting elements are located between the first surface of the heat sink body and the outer surface of the electronic device so as to form a vaporization chamber between the first surface of the heat sink body and the outer surface of the electronic device, in which when the heat sink body receives the working fluid through the pores, the working fluid in the heat sink body absorbs heat generated by the electronic device and then is vaporized. The working fluid in the pores is vaporized to absorb heat, and heat generated by the electronic device is removed through the heat sink body.

In certain embodiments of the present disclosure, the heat sink body is the porous structure that is composed of a diatomaceous earth.

In certain embodiments of the present disclosure, each of the pasting elements has a thickness within a range of 0.5 mm to 1.5 mm.

In certain embodiments of the present disclosure, the pasting elements include synthetic colloids having calcium carbonate.

In conclusion, the fluid heat dissipation device of the present disclosure includes the heat sink body and the pasting elements. The heat sink body is the porous structure and the pores are configured to enable the heat sink body to absorb the working fluid. The pasting elements are fixed on the first surface of the heat sink body. The pasting elements include polymer materials and are sheet-like colloids. The heat sink body is configured to be fixedly attached on the outer surface of the electronic device through the pasting elements. The working fluid is configured to be vaporized through the heat sink body to provide a rapid heat dissipation function.

Due to the material characteristics, in the present disclosure, the structure of the fluid heat dissipation device is simplified and has characteristics of environmental protection, energy saving, not requiring power supply, not producing fan noise, and not producing vibration interference, and the weight of the heat sink body is lighter. The pasting elements have strong adsorption force and can be fixedly attached on the electronic device. Accordingly, the pasting elements do not fall off easily, and are simple and convenient to install.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
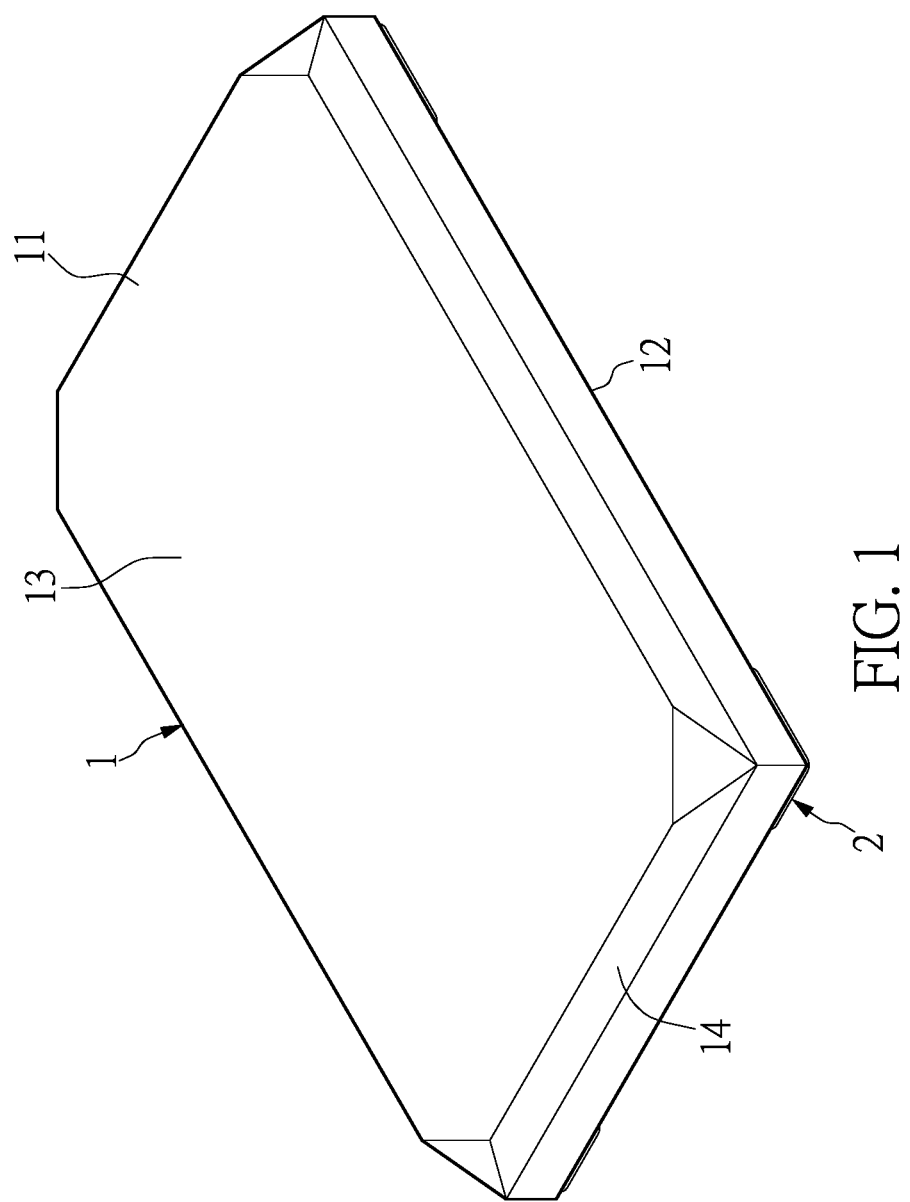
FIG. 1 is a perspective view of a fluid heat dissipation device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
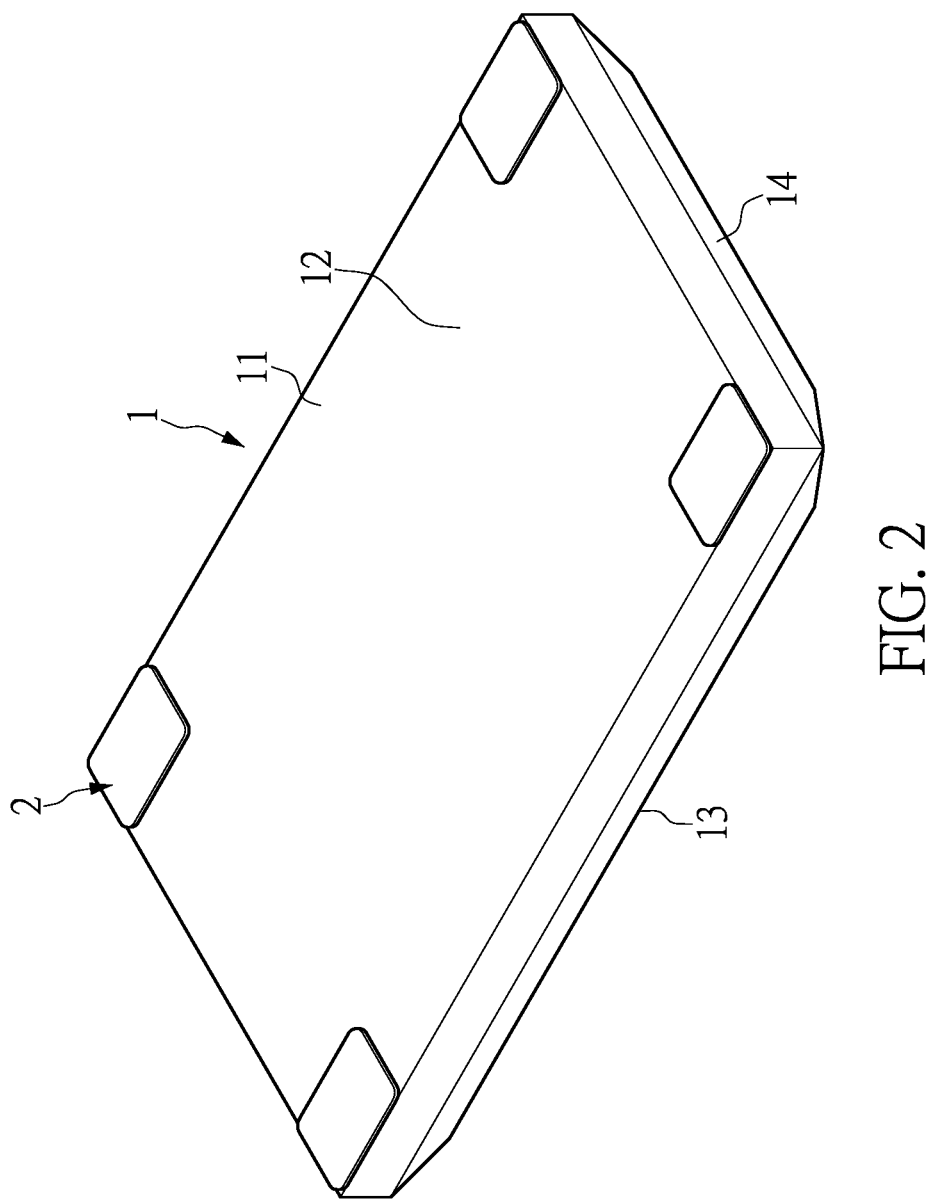
FIG. 2 is another perspective view of the fluid heat dissipation device according to an embodiment of the present disclosure.
Figure 3:
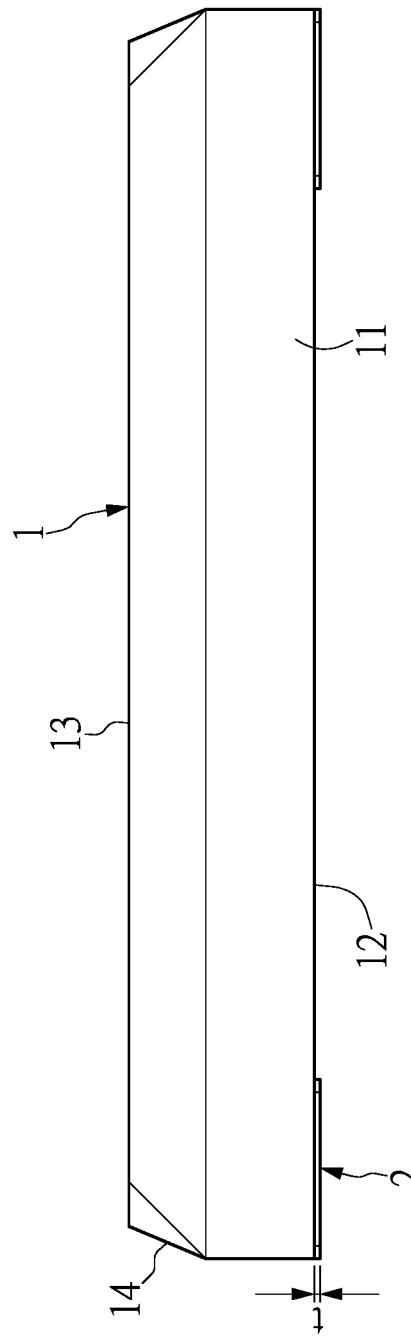
FIG. 3 is a planar view of the fluid heat dissipation device according to an embodiment of the present disclosure.

Referring to FIG. 1 to FIG. 3, an embodiment of the present disclosure provides a fluid heat dissipation device that can be fixedly attached on electronic devices, such as mobile phones, laptops, and tablets, so as to assist in cooling of the electronic devices. The fluid heat dissipation device includes a heat sink body 1 and a plurality of pasting elements 2.

The heat sink body 1 can be composed of a diatomaceous earth, and the main component of the heat sink body 1 can be the diatomaceous earth, but a proportion of the diatomaceous earth in the heat sink body 1 is not limited. For example, a percentage by weight of the diatomaceous earth in the heat sink body 1 can be within a range of 10% to 90%. The heat sink body 1 can be a porous structure that is composed of the diatomaceous earth. The heat sink body 1 includes a plurality of pores 11 that are distributed on the heat sink body 1. The pores 11 can be distributed on the entirety of the heat sink body 1 to form a capillary structure. The pores 11 are configured to enable the heat sink body to absorb a working fluid (liquid or gas), that is, the adequate working fluid can be added on the heat sink body 1 and then be stored in the pores 11.

The diatomaceous earth is a type of biochemical sedimentary rock that is deposited from cell walls of diatoms and has low density, high porosity, and powerful water absorption. In the present embodiment, the heat sink body 1 can be in a sheet-like shape or a plate-like shape, and the shapes or the sizes thereof are not limited. The shape or the size of the heat sink body 1 can be adjusted according to different types of the electronic devices. The heat sink body 1 can be in a rectangular shape, a round shape or various other shapes, in the present embodiment, the heat sink body 1 is in a rectangular shape.

The heat sink body 1 has a first surface 12 and a second surface 13. The first surface 12 and the second surface 13 are respectively located on two opposite sides of the heat sink body. Preferably, the first surface 12 is a flat surface, and the first surface 12 is configured to be close to an outer surface of the electronic device. A part of the first surface 12 corresponding to a heat source is configured to absorb heat generated by a heat source of the electronic device and then the first surface 12 forms a heat-absorbing end.

The second surface 13 can also be a flat surface. The second surface 13 is parallel to the first surface 12, but it is not limited thereto. For example, the second surface 13 can be a surface with different variations of convexity or with various modeling variations. In the present embodiment, the heat sink body has a bevel surface 14 arranged at an edge thereof that is adjacent to the second surface 13. The bevel surface 14 can be arranged to surround the edge of the heat sink body 1 so that the bevel surface 14 can be configured to prevent the electronic device from being scratched by four corners and the edges of the heat sink body 1.

The pasting elements 2 are fixed on the first surface 12 of the heat sink body 1. Preferably, the pasting elements 2 are disposed at an edge of the first surface 12 of the heat sink body 1 that is close to the heat sink body 1. The pasting elements 2 include polymer materials and are sheet-like colloids. The pasting elements 2 can be made of polymeric polymers, or a mixture of polymeric polymers and other materials to form synthetic colloids. In the present embodiment, the pasting elements 2 further include calcium carbonate. That is, the pasting elements 2 are sheet-like colloids that include calcium carbonate. Calcium carbonate in the pasting elements 2 modifies the material of the pasting elements 2, increasing tensile strength, tear resistance and hardness thereof. The pasting elements 2 are not limited in shape and can be in a rectangular shape, round shape or various other shapes.

In the present embodiment, the pasting elements 2 are in a rectangular shape. The pasting elements 2 correspond to the shape of the heat sink body 1 and are disposed at four corners of the first surface 12 that are close to the heat sink body 1. The number of the pasting elements 2 and the positions of the pasting elements 2 on the first surface 12 of the heat sink body 1 are not limited, and can be adjusted according to requirements. Preferably, each of the pasting elements 2 has a thickness t within a range of 0.5 mm to 1.5 mm, preferably 1 mm, but it is not limited thereto. The thickness of each of the pasting elements 2 can be adjusted according to requirements. The collides of the pasting elements 2 can permeate inside of the heat sink body 1 so that a greater bonding force between the pasting elements 2 and the heat sink body 1 is provided. Accordingly, the pasting elements 2 can be stably fixed on the heat sink body 1.

Figure 4:
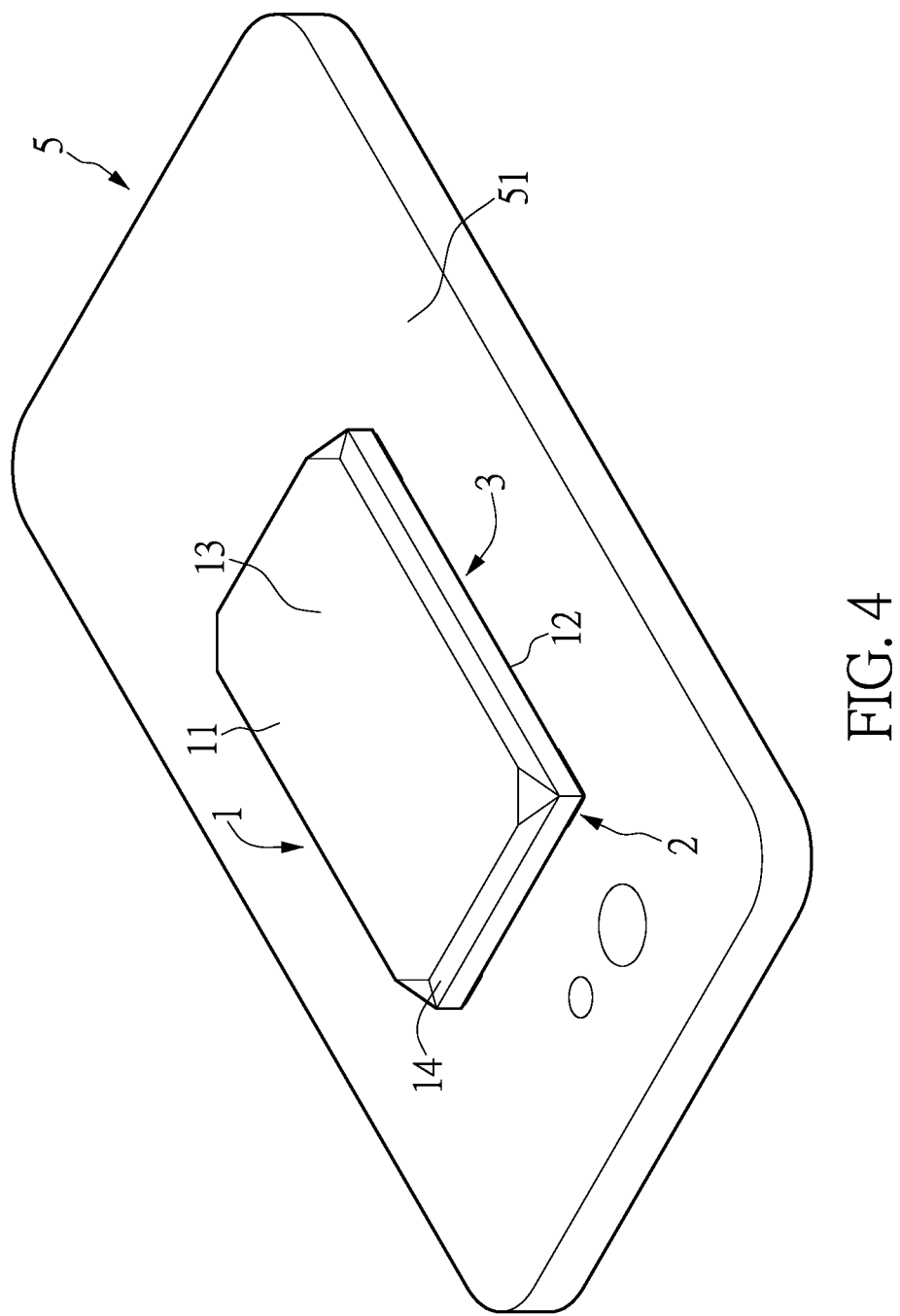
FIG. 4 is a perspective view of a usage status of the fluid heat dissipation device according to an embodiment of the present disclosure.
Figure 5:
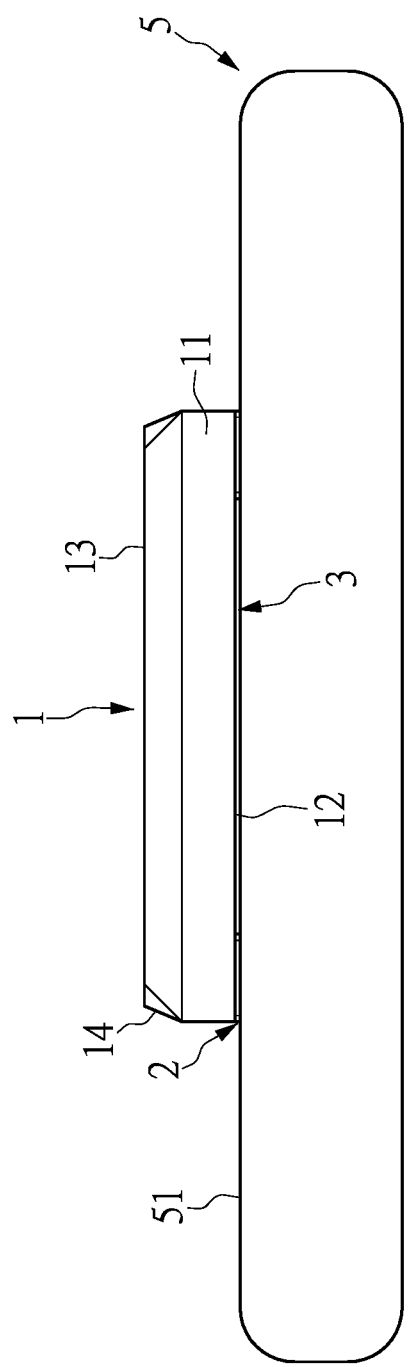
FIG. 5 is a planar view of the usage status of the fluid heat dissipation device according to an embodiment of the present disclosure.

As shown in FIG. 4 and FIG. 5, the heat sink body 1 of the present disclosure can be fixedly attached on the outer surface 51 of electronic devices 5, such as mobile phones, laptops, and tablets through the pasting elements 2. Preferably, the heat sink body 1 corresponds to a heat source of the electronic device 5, and the outer surface of the electronic device 5 is generally a flat surface so that the pasting elements 2 can be more stably and fixedly attached onto the electronic device 5 and the collides of the pasting elements 2 will not permeate inside of the electronic device 5.

The pasting elements 2 can produce a greater suction effect than the suction cups and have a greater bonding force. The bonding force between the pasting elements 2 and the heat sink body 1 is greater than a bonding force between the pasting elements 2 and the electronic device 5. Accordingly, the pasting elements 2 can be separated from the outer surface 51 of the electronic device 5 by lightly applying a force thereto. Since the pasting elements 2 have the thickness, the pasting elements 2 can provide a function of padding height. Accordingly, a vaporization chamber (interval) 3 is formed between the first surface 12 of the heat sink body 1 and the outer surface 51 of the electronic device 5.

The vaporization chamber 3 can extract and recycle condensate so that the fluid heat dissipation device of the present disclosure has water-cooled and air-cooled functions. That is, the fluid heat dissipation device of the present disclosure has a dual-mode heat dissipation effect. The fluid heat dissipation device of the present disclosure can function as a normal heat sink without the working fluid. Specifically speaking, the fluid heat dissipation device functions as a liquid-cooled radiator when the working fluid (water) is provided, and the fluid heat dissipation device functions as an air-cooled radiator when the working fluid is not provided.

Furthermore, the pasting elements 2 have the thickness and are disposed at the four corners or the edge of the first surface 12 that is close to the heat sink body 1. Accordingly, the four corners or the edge of the heat sink body 1 can be shielded so that the pasting elements 2 can prevent the electronic device 5 from being scratched by four corners or the edge of the heat sink body 1. When the user does not need to use the fluid heat dissipation device, the user can separate the pasting elements 2 from the outer surface 51 of the electronic device 5 by lightly applying a force thereto. Accordingly, the fluid heat dissipation device is separated from the electronic device 5.

The heat sink body 1 is characterized by nano-sized pores, a low density and a high specific surface area, and the heat sink body 1 has a great capillary structure. When the working fluid such as water is filled in the capillary structure of the heat sink body 1, the working fluid can be limited in the nano-sized pores of the heat sink body 1 so that the capillary structure can be used to improve the flow efficiency of the working fluid in response to the capillary action. According to a moisture absorption function, a vaporization function of the capillary action, differences in humidity or moisture of an inside and an outside of the nano-sized pores reach equilibrium. Accordingly, water in the nano-sized pores can move automatically along a dry surface of the nano-sized pores through the adhesion and the cohesion of the water.

When the working fluid such as water is added in the capillary structure of the heat sink body 1, the working fluid absorbs heat generated by the electronic device 5 on one side of the heat sink body 1 by means of a phase-change and becomes a gas. The working fluid transfers heat through the pore 11 (capillary structure) to the other side (cold end) of the heat sink body 1, and the working fluid in the pore 11 can absorb heat and vaporize rapidly to release moisture. The heat sink body 1 absorbs heat generated by the working fluid and vaporizes it to remove heat. That is, the heat sink body 1 can rapidly absorb, transport, diffuse, and emit the work fluid to discharge the working fluid out of the heat sink body 1 and balance the humidity. The high nanopores of the heat sink body 1 of the present disclosure can rapidly release moisture and achieve great heat dissipation effect without high temperature conditions. Accordingly, the heat sink body 1 is especially suitable for heat dissipation in handheld electronic devices.

In the present embodiment, the working fluid is water (liquid). The heat sink body 1 has a fast water absorption function and can pre-absorb the working fluid. The heat sink body 1 can absorb working fluid up to several times its own weight, and the heat sink body 1 has a thermal insulation function to keep the working fluid cold. The heat sink body 1 has a moisture regulation function.

When the temperature around the heat sink body 1 rises, the diatomaceous earth having the high nanopores can release the moisture rapidly. In the present embodiment, the heat sink body 1 having the high nanopores muffles noise by the adsorption of the high nanopores of the heat sink body 1 to provide a sound-absorbing function that can be used to reduce the fan noise from the electronic device 5. In the present embodiment, the heat sink body 1 having the high nanopores also allows the odor to be deodorized by the adsorption of the high nanopores of the heat sink body 1 to provide a deodorization function. Accordingly, the odor generated by the high temperature of the high-speed computing from the electronic device 5 can be reduced.

In conclusion, the fluid heat dissipation device of the present disclosure includes the heat sink body and the pasting elements. The heat sink body is the porous structure and the pores are configured to enable the heat sink body to absorb the working fluid. The pasting elements are fixed on the first surface of the heat sink body. The pasting elements include the polymer materials and are sheet-like colloids. The heat sink body is configured to be fixedly attached on the outer surface of the electronic device through the pasting elements. The heat sink body is configured to vaporize the working fluid to provide a rapid heat dissipation function.

Due to the material characteristics of the fluid heat dissipation device, in the present disclosure, the structure of the fluid heat dissipation device is simplified and has the characteristics of environmental protection (conventional suction cup or cassette have complex structures and use a higher amount of plastic, which results in high contamination), energy saving, not requiring power supply, not producing fan noise, and not producing vibration interference, and the weight of the heat sink body is lighter.

The pasting elements have strong adsorption force and can be fixedly attached on the electronic device. Accordingly, the pasting elements do not fall off easily, and are simple and convenient to install. Furthermore, the vaporization chamber is formed between the first surface of the heat sink body and the outer surface of the electronic device. The heat sink body does not press against the outer surface of the electronic device (the conventional heat sink body presses against the outer surface of the electronic device and the working fluid cannot diffuse). The vaporization chamber has an active heat dissipation effect. The vaporization chamber can more effectively absorb heat generated by the working fluid through the heat sink body and vaporizes and discharges the heated working fluid.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A fluid heat dissipation device, comprising:
   a heat sink body being a porous structure and including a plurality of pores that are configured to enable the heat sink body to absorb a working fluid, wherein the heat sink body has a first surface and a second surface, and the first surface and the second surface are respectively located on two opposite sides of the heat sink body; and a plurality of pasting elements fixed on the first surface of the heat sink body, wherein the pasting elements include polymer materials and are sheet-liked colloids, wherein the heat sink body is configured to be fixedly attached onto an outer surface of an electronic device through the pasting elements, the first surface is close to the outer surface of the electronic device, and the pasting elements are located between the first surface of the heat sink body and the outer surface of the electronic device so as to form a vaporization chamber between the first surface of the heat sink body and the outer surface of the electronic device, wherein when the heat sink body receives the working fluid through the pores, the working fluid in the heat sink body is configured to absorb heat from the electronic device and then be vaporized, and the working fluid in the pores is vaporized so that heat from the electronic device is removed through the heat sink body.

2. The fluid heat dissipation device according to claim 1, wherein the heat sink body is the porous structure that is composed of a diatomaceous earth.

3. The fluid heat dissipation device according to claim 1, wherein the first surface is a flat surface.

4. The fluid heat dissipation device according to claim 1, wherein the heat sink body has a bevel surface arranged at an edge thereof that is adjacent to the second surface, and the bevel surface is arranged to surround the edge of the heat sink body.

5. The fluid heat dissipation device according to claim 1, wherein the heat sink body and the pasting elements are in a rectangular shape, and the pasting elements are disposed at four corners of the first surface that are close to the heat sink body.

6. The fluid heat dissipation device according to claim 1, wherein each of the pasting elements has a thickness within a range of 0.5 mm to 1.5 mm.

7. The fluid heat dissipation device according to claim 1, wherein the pasting elements include synthetic colloids having calcium carbonate.

8. The fluid heat dissipation device according to claim 1, wherein the pasting elements are disposed at an edge of the first surface that is close to the heat sink body.

* * * * *